US008971479B2

(12) United States Patent
Chang et al.

(10) Patent No.: US 8,971,479 B2
(45) Date of Patent: Mar. 3, 2015

(54) GATE DRIVING CIRCUIT

(71) Applicant: AU Optronics Corp., Hsin-Chu (TW)

(72) Inventors: Ching-Hui Chang, Hsin-Chu (TW);
Pin-Yu Chan, Hsin-Chu (TW); Kai-Wei Hong, Hsin-Chu (TW); Yung-Chih Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 45 days.

(21) Appl. No.: 13/802,690

(22) Filed: Mar. 13, 2013

(65) Prior Publication Data
US 2014/0103983 A1 Apr. 17, 2014

(30) Foreign Application Priority Data
Oct. 11, 2012 (TW) .............................. 101137479 A

(51) Int. Cl.
G11C 19/00 (2006.01)
H03K 3/015 (2006.01)
G09G 3/36 (2006.01)

(52) U.S. Cl.
CPC .............. H03K 3/015 (2013.01); G09G 3/3655 (2013.01)
USPC ................................... 377/64; 377/68; 377/79

(58) Field of Classification Search
None
See application file for complete search history.

(56) References Cited

U.S. PATENT DOCUMENTS

| 7,436,923 | B2 | 10/2008 | Tobita |
| 7,688,934 | B2* | 3/2010 | Tsai et al. ........................ 377/64 |
| 7,817,770 | B2* | 10/2010 | Chang et al. .................... 377/64 |
| 8,019,039 | B1* | 9/2011 | Tsai .................................. 377/64 |
| 8,396,183 | B2* | 3/2013 | Yang et al. ....................... 377/64 |
| 8,515,000 | B2* | 8/2013 | Yang et al. ....................... 377/64 |
| 8,537,094 | B2* | 9/2013 | Yang et al. ..................... 345/100 |
| 8,552,961 | B2* | 10/2013 | Yang et al. ..................... 345/100 |
| 8,565,369 | B2* | 10/2013 | Takahashi et al. ............... 377/64 |
| 2008/0079701 | A1 | 4/2008 | Shin |
| 2010/0260312 | A1* | 10/2010 | Tsai et al. ........................ 377/79 |
| 2011/0007863 | A1* | 1/2011 | Tsai et al. ........................ 377/79 |
| 2013/0266113 | A1* | 10/2013 | Tsuge et al. ..................... 377/64 |
| 2013/0272486 | A1* | 10/2013 | Hsu et al. ......................... 377/64 |
| 2014/0105351 | A1* | 4/2014 | Chan et al. ....................... 377/64 |

FOREIGN PATENT DOCUMENTS

CN 101369460 A 2/2009

* cited by examiner

Primary Examiner — Tuan T Lam
(74) Attorney, Agent, or Firm — Winston Hsu; Scott Margo

(57) ABSTRACT

A shift register of a gate driving circuit includes a pull-up unit for pulling up a first output signal and a first gate signal to a high voltage level according to a driving voltage and a high-frequency clock signal, a start-up unit for transmitting a second gate signal, an energy-store unit for providing the driving voltage to the pull-up unit according to the second gate signal, a first discharging unit for pulling down the driving voltage to a first voltage level according to a first control signal, a first leakage-preventing unit for turning off the first discharging unit when the first gate signal reaches the high voltage level, a first pull-down unit for respectively pulling down the first output and first gate signals to the first and a second voltage levels according to the first control signal, and a first control unit for generating the first control signal.

11 Claims, 6 Drawing Sheets

GATE DRIVING CIRCUIT

BACKGROUND OF THE INVENTION

1. Field of the Invention

The present invention relates to a gate driving circuit, and more particularly, to a gate driving circuit capable of reducing current leakage.

2. Description of the Prior Art

In general, a liquid crystal display device comprises a plurality of pixel units, a gate driving circuit, and a source driving circuit. The source driving circuit is for providing a plurality of data signals. The gate driving circuit comprises plural-stage shift registers for providing a plurality of gate driving signals in order to control the plurality of pixel units to be written with the plurality of data signals.

Please refer to FIG. 1. FIG. 1 is a diagram showing a gate driving circuit 100 of the prior art. As shown in FIG. 1, the gate driving circuit 100 comprises plural-stage shift registers. For ease of explanation, the gate driving circuit only illustrates an (N−1)th stage shift register 110, an Nth stage shift register 120, and an (N+1)th stage shift register 130. The Nth stage shift register 120 is for generating an output signal ST(n) on an output line OL(n) and for generating a gate signal G(n) on a gate line SL(n). The gate signal G(n) is transmitted to a pixel array via the gate line SL(n) in order to turn on corresponding pixel units. In addition, the output signal ST(n) and the gate signal G(n) are transmitted to the (N+1)th stage shift register 130 in order to enable the (N+1)th stage shift register 130. Each of the shift register 110, 120, 130 comprises an energy-store unit, such as a capacitor for pulling up the output signal and the gate signal.

However, in operation of the shift register 110, 120, 130, improper circuit design of the shift register 110, 120, 130 may cause the energy-store unit current leakage, such that the gate signal G(n−1), G(n), G(N+1) may not be able to be pulled up to a target voltage level smoothly, thus the gate driving circuit 100 can not work properly.

SUMMARY OF THE INVENTION

The present invention provides a gate driving circuit capable of preventing current leakage, which includes plural-stage shift registers. An Nth stage shift register of the plural-stage shift registers includes a pull-up unit electrically connected to an output line and a gate line for pulling up a first output signal of the output line and a first gate signal of the gate line to a high voltage level according to a driving voltage and a high-frequency clock signal; a start-up unit for transmitting a second gate signal according to a second output signal; an energy-store unit electrically connected to the pull-up unit and the start-up unit for performing a charging process to provide the driving voltage to the pull-up unit according to the second gate signal; a first discharging unit electrically connected to the energy-store unit for pulling down the driving voltage to a first voltage level according to a first control signal; a first leakage-preventing unit electrically connected to the first discharging unit for turning off the first discharging unit according to the first control signal, the driving voltage, and the first output signal when the first gate signal reaches the high voltage level; a first pull-down unit electrically connected to the output line and the gate line for respectively pulling down the first output signal and the first gate signal to the first voltage level and a second voltage level according to the first control signal; and a first control unit electrically connected to the first discharging unit and the first pull-down unit for generating the first control signal according to the driving voltage, a first low-frequency clock signal, and a third voltage level; wherein the first voltage level, the second voltage level, and the third voltage level are different voltage levels.

The present invention further provides a method for preventing current leakage of a shift register. The method comprises providing a shift register comprising an energy-store unit for performing a charging process according to a previous-stage gate signal in order to provide a driving voltage, and a transistor having a first terminal electrically connected to the energy-store unit for pulling down the driving voltage of the energy-store unit to a low voltage level when being turned on; and when a gate signal outputted by the shift register is pulled up to a high voltage level according to the driving voltage, controlling a voltage level of the second terminal of the transistor, such that the voltage level of the second terminal of the transistor is higher than a voltage level of a control terminal of the transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
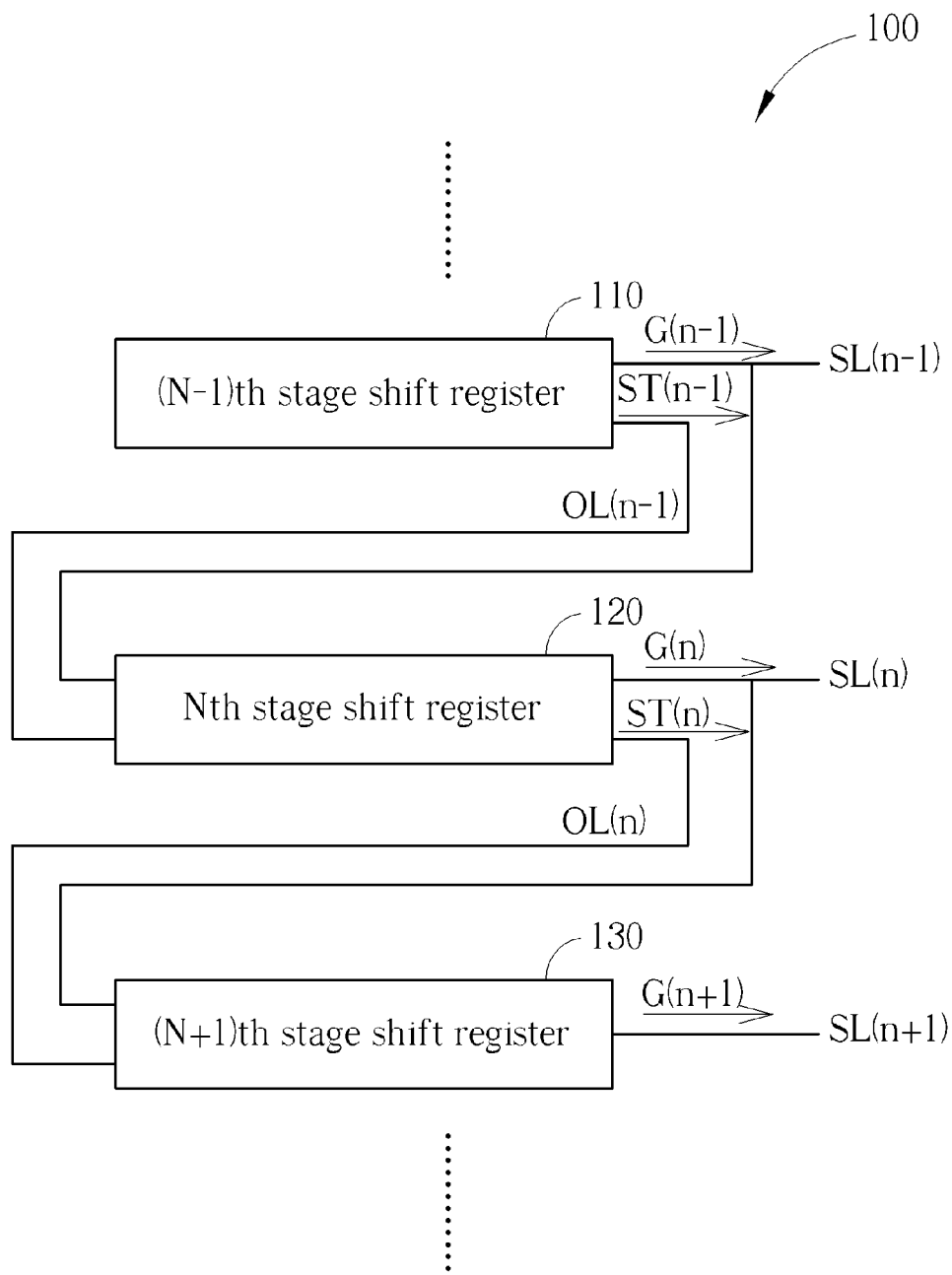
FIG. 1 is a diagram showing a gate driving circuit of the prior art.
Figure 2:
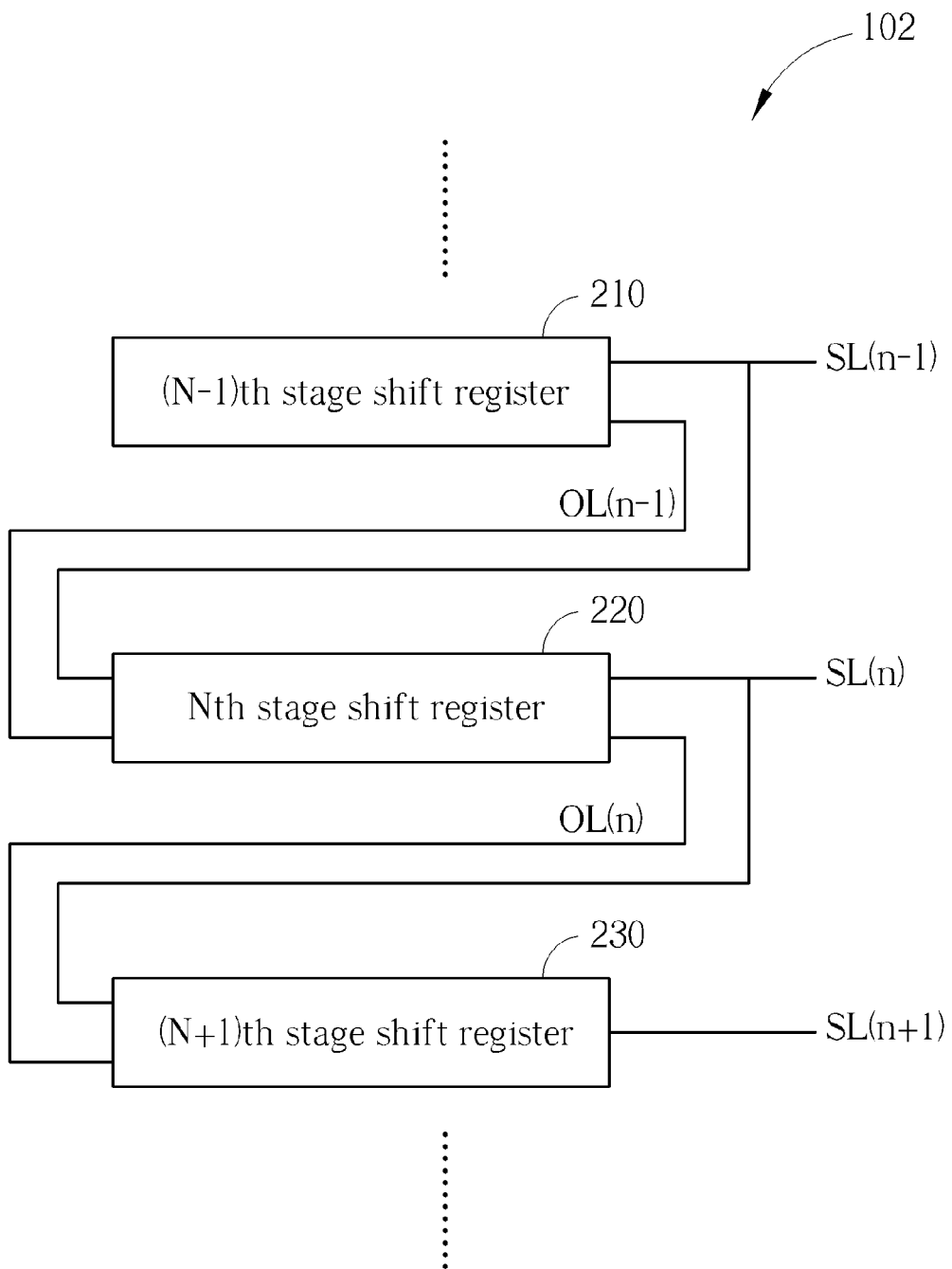
FIG. 2 is a diagram showing a gate driving circuit of the present invention.
Figure 3:
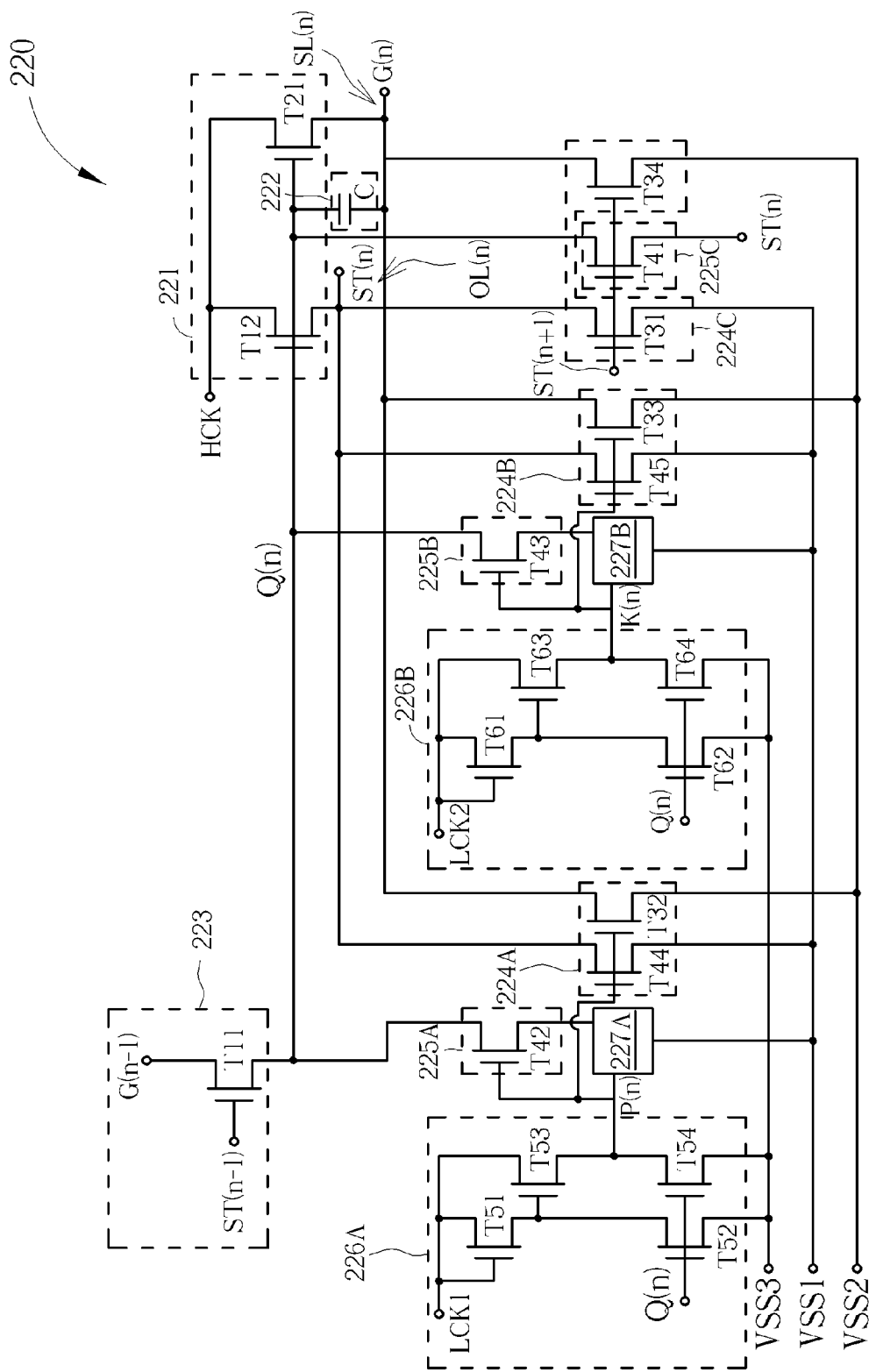
FIG. 3 is a diagram showing an Nth stage shift register of the gate driving circuit in FIG. 2.
Figure 4:
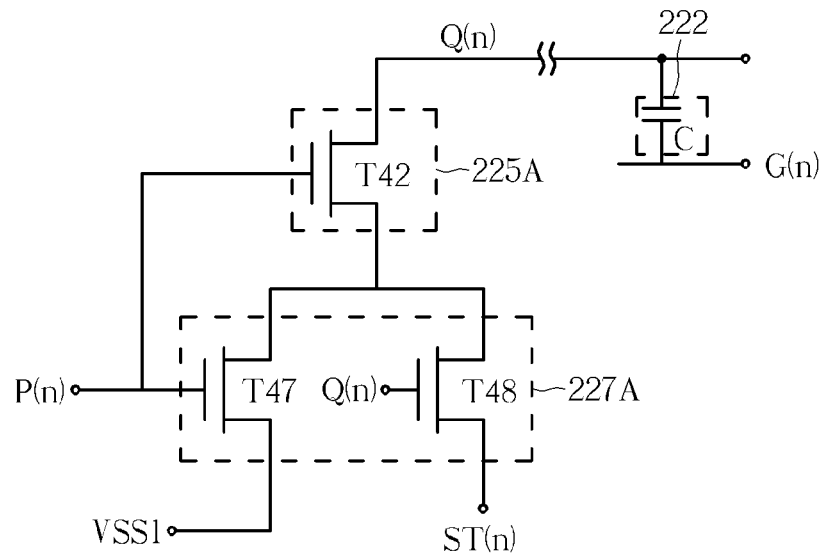
FIG. 4 is a diagram showing a first leakage-preventing unit of the Nth stage shift register in FIG. 3.
Figure 5:
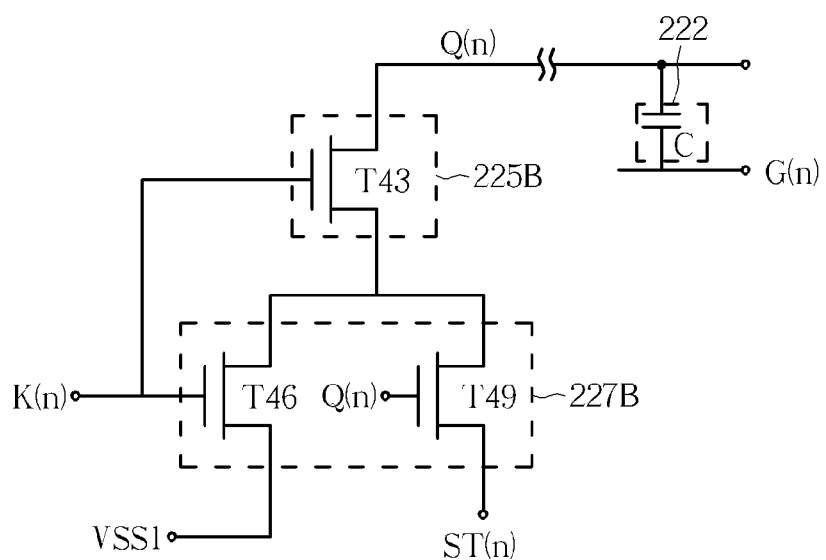
FIG. 5 is a diagram showing a second leakage-preventing unit of the Nth stage shift register in FIG. 3.

Please refer to FIG. 2 to FIG. 5. FIG. 2 is a diagram showing a gate driving circuit 200 of the present invention. FIG. 3 is a diagram showing an Nth stage shift register 220 of the gate driving circuit 200 in FIG. 2. FIG. 4 is a diagram showing a first leakage-preventing unit 227A of the Nth stage shift register 220 in FIG. 3. FIG. 5 is a diagram showing a second leakage-preventing unit 227B of the Nth stage shift register 220 in FIG. 3. As shown in figures, the gate driving circuit 200 comprises plural-stage shift registers. For ease of explanation, the gate driving circuit only illustrates an (N−1)th stage shift register 210, an Nth stage shift register 220, and an (N+1)th stage shift register 230, wherein only an internal structure of the Nth stage shift register 220 is illustrated in the FIG. 3. The other shift registers are similar to the Nth stage shift register 220, thus, no further illustration is provided. The (N−1)th stage shift register 210 is for providing an output signal ST(n−1) and a gate signal G(n−1). The Nth stage shift register 220 is for providing an output signal ST(n) and a gate signal G(n). The (N+1)th stage shift register 230 is for providing an output signal ST(n+1) and a gate signal G(n+1). The gate signals G(n−1), G(n), G(n+1) are sequentially transmitted to a pixel array via gate lines SL(n−1), SL(n), SL(n+1), in order to turn on corresponding pixel units. In addition, the output signal ST(n−1) and the gate signal G(n−1) are transmitted to the Nth stage shift register 220 in order to enable the Nth stage shift register 220; and the output signal ST(n) and the gate signal G(n) are transmitted to the (N+1)th stage shift register 230 in order to enable the (N+1)th stage shift register 230.

The Nth stage shift register 220 comprises a pull-up unit 221, an energy-store unit 222, a start-up unit 223, a first pull-down unit 224A, a second pull-down unit 224B, a first discharging unit 225A, a second discharging unit 225B, a first control unit 226A, a second control unit 226B, a first leakage-preventing unit 227A, and a second leakage-preventing unit 227B. The pull-up unit 221 is electrically connected to an output line OL(n) and the gate line SL(n) for pulling up the output signal ST(n) of the output line OL(n) and the gate signal G(n) of the gate line SL(n) to a high voltage level according to a driving voltage Q(n) stored in the energy-store unit 222 and a high-frequency clock signal HCK. The start-up unit 223 is for transmitting the gate signal G(n−1) of the (N−1)th stage shift register 210 to the energy-store unit 222 according to the output signal ST(n−1) of the (N−1)th stage shift register 210. The energy-store unit 222 is electrically connected to the pull-up unit 221 and the start-up unit 223 for performing a charging process to provide the driving voltage Q(n) to the pull-up unit 221 according to the gate signal G(n−1) transmitted from the start-up unit 223.

The first discharging unit 225A is electrically connected to the energy-store unit 222 for performing a discharging process on the energy-store unit 222 to pull down the driving voltage Q(n) to a first voltage level VSS1 according to a first control signal P(n). The first leakage-preventing unit 227A is electrically connected to the first discharging unit 225A for turning off the first discharging unit 225A when the gate signal G(n) is pulled up to a high voltage level according to the first control signal P(n), the driving voltage Q(n), and the output signal ST(n). The first pull-down unit 224A is electrically connected to the output line OL(n) and the gate line SL(n) for pulling down the output signal ST(n) to the first voltage level VSS1 and pulling down the gate signal G(n) to a second voltage level VSS2 according to the first control signal P(n). The first control unit 226A is electrically connected to the first discharging unit 225A and the first pull-down unit 224A for generating the first control signal P(n) according to the driving voltage Q(n), a first low-frequency clock signal LCK1, and a third voltage level VSS3.

Similarly, the second discharging unit 225B is electrically connected to the energy-store unit 222 for performing a discharging process on the energy-store unit 222 to pull down the driving voltage Q(n) to the first voltage level VSS1 according to a second control signal K(n). The second leakage-preventing unit 227B is electrically connected to the second discharging unit 225B for turning off the second discharging unit 225B when the gate signal G(n) is pulled up to the high voltage level according to the second control signal K(n), the driving voltage Q(n), and the output signal ST(n). The second pull-down unit 224B is electrically connected to the output line OL(n) and the gate line SL(n) for pulling down the output signal ST(n) to the first voltage level VSS1 and pulling down the gate signal G(n) to the second voltage level VSS2 according to the second control signal K(n). The second control unit 226B is electrically connected to the second discharging unit 225B and the second pull-down unit 224B for generating the second control signal K(n) according to the driving voltage Q(n), a second low-frequency clock signal LCK2, and the third voltage level VSS3.

Wherein, a phase of the second low-frequency clock signal LCK2 is opposite to a phase of the first low-frequency clock LCK1 signal. Therefore, the first discharging unit 225A and the second discharging unit 225B can alternately perform the discharging processes on the energy-store unit 222, and the first pull-down unit 224A and the second pull-down unit 224B can alternately pull down the output signal ST(n) and the gate signal G(n).

In addition, the first voltage level VSS1, the second voltage level VSS2, and the third voltage level VSS3 are different low voltage levels. In the above embodiments, the first voltage level VSS1 (such as −13V) is lower than the third voltage level VSS3 (such as −10V), and the third voltage level VSS3 is lower than the second voltage level VSS2 (such as −7V).

In the present embodiment, the pull-up unit 221 comprises a transistor T21 and a transistor T12. A first terminal of the transistor T21 is for receiving the high-frequency clock signal HCK, a control terminal of the transistor T21 is electrically connected to the energy-store unit 222 for receiving the driving voltage Q(n), and a second terminal of the transistor T21 is electrically connected to the gate line SL(n). A first terminal of the transistor T12 is for receiving the high-frequency clock signal HCK, a control terminal of the transistor T12 is electrically connected to the energy-store unit 222 for receiving the driving voltage Q(n), and a second terminal of the transistor T12 is electrically connected to the output line OL(n). The energy-store unit 222 comprises a capacitor C. The start-up unit 223 comprises a transistor T11. A first terminal of the transistor T11 is for receiving the gate signal G(n−1), a control terminal of the transistor T11 is for receiving the output signal ST(n−1), and a second terminal of the transistor T11 is electrically connected to the energy-store unit 222.

The first discharging unit 225A comprises a transistor T42. A first terminal of the transistor T42 is electrically connected to the energy-store unit 222, a control terminal of the transistor T42 is electrically connected to the first control unit 226A for receiving the first control signal P(n), and a second terminal of the transistor T42 is electrically connected to the first leakage-preventing unit 227A.

The first leakage-preventing unit 227A comprises a transistor T47 and a transistor T48. A first terminal of the transistor T47 is electrically connected to the second terminal of the transistor T42, a control terminal of the transistor T47 is electrically connected to the first control unit 226A for receiving the first control signal P(n), and a second terminal of the transistor T47 is electrically connected to the first voltage level VSS1. A first terminal of the transistor T48 is electrically connected to the second terminal of the transistor T42, a control terminal of the transistor T48 is electrically connected to the energy-store unit 222 for receiving the driving voltage Q(n), and a second terminal of the transistor T48 is electrically connected to the output line OL(n) for receiving the output signal ST(n).

The first pull-down unit 224A comprises a transistor T44 and a transistor T32. A first terminal of the transistor T44 is electrically connected to the output line OL(n), a control terminal of the transistor T44 is electrically connected to the first control unit 226A for receiving the first control signal P(n), and a second terminal of the transistor T44 is electrically connected to the first voltage level VSS1. A first terminal of the transistor T32 is electrically connected to the gate line SL(n), a control terminal of the transistor T32 is electrically connected to the first control unit 226A for receiving the first control signal P(n), and a second terminal of the transistor T32 is electrically connected to the second voltage level VSS2.

The first control unit 226A comprises a transistor T51, a transistor T52, a transistor T53, and a transistor T54. A first terminal of the transistor T51 is for receiving the first low-frequency clock signal LCK1, a control terminal of the transistor T51 is for receiving the first low-frequency clock signal LCK1. A first terminal of the transistor T52 is electrically connected to the second terminal of the transistor T51, a control terminal of the transistor T52 is electrically connected to the energy-store unit 222 for receiving the driving voltage Q(n), and a second terminal of the transistor T52 is electrically connected to the third voltage level VSS3. A first terminal of the transistor T53 is for receiving the first low-frequency clock signal LCK1, a control terminal of the transistor T53 is electrically connected to the second terminal of the transistor T51, and a second terminal of the transistor T53 is electrically connected to the first discharging unit 225A, the first leakage-preventing unit 227A, and the first pull-down unit 224A. A first terminal of the transistor T54 is electrically connected to the second terminal of the transistor T53, a control terminal of the transistor T54 is electrically connected to the energy-store unit 222 for receiving the driving voltage Q(n), and a second terminal of the transistor T54 is electrically connected to the first voltage level VSS1.

On the other hand, in the present embodiment, arrangements of the second discharging unit 225B, the second leakage-preventing unit 227B, the second pull-down unit 224B, and the second control unit 226B are respectively similar to arrangements of the first discharging unit 225A, the first leakage-preventing unit 227A, the first pull-down unit 224A, and the first control unit 226A. Thus, no further illustration is provided.

In addition, the Nth stage shift register 220 further comprises a third discharging unit 225C and a third pull-down unit 224C. The third discharging unit 225C is electrically connected to the energy-store unit 222 for pulling down the driving voltage Q(n) according to the output signal ST(n+1) of the (N+1)th stage shift register 230. The third pull-down unit 224C is electrically connected to the output line OL(n) and the gate line SL(n) for pulling down the output signal ST(n) to the first voltage level VSS1 and pulling down the gate signal G(n) to the second voltage level VSS2 according to the output signal ST(n+1).

Figure 6:
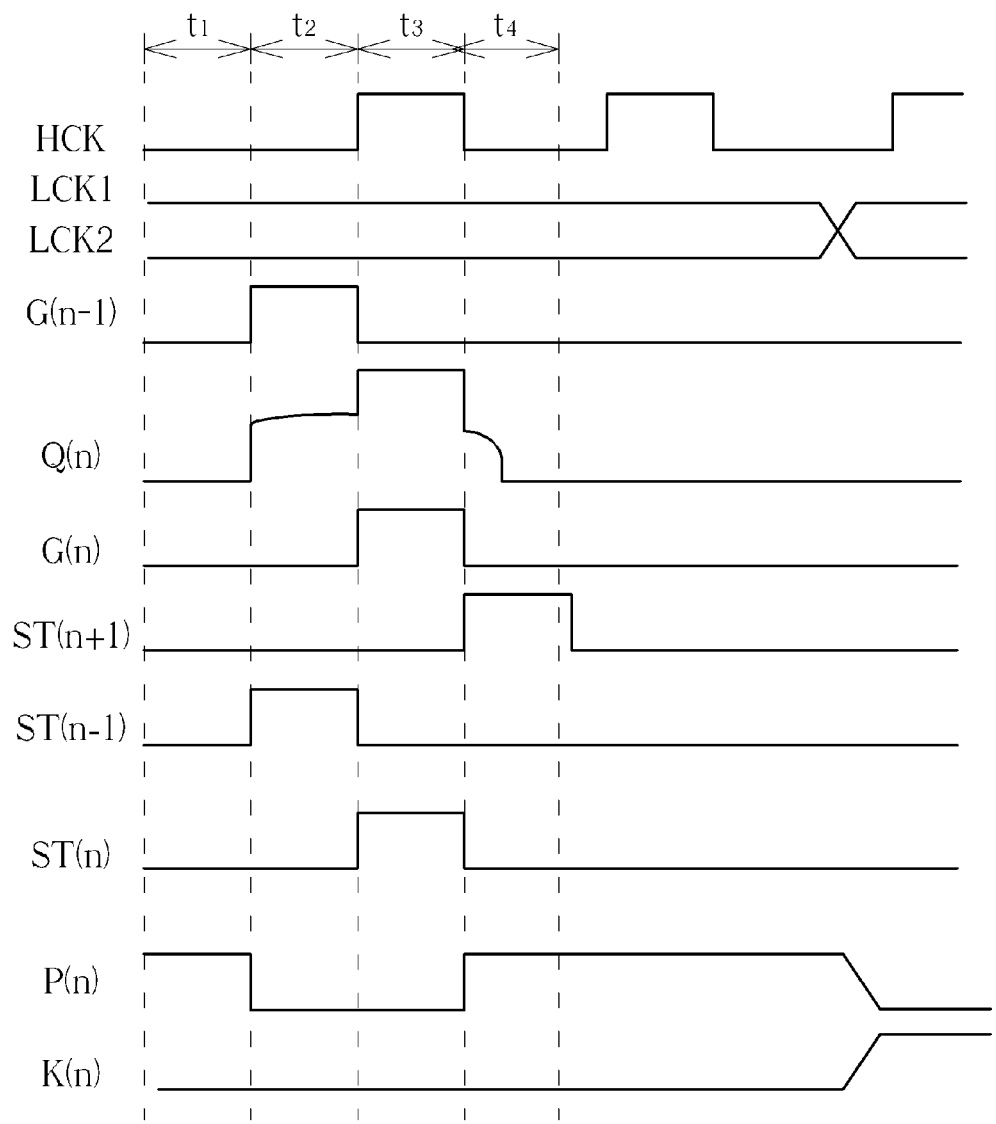
FIG. 6 is a diagram showing waveforms of related signals of the gate driving circuit in FIG. 2.

Please refer to FIG. 6, and refer to FIG. 2 to FIG. 5 as well. FIG. 6 is a diagram showing waveforms of related signals of the gate driving circuit in FIG. 2. As shown in FIG. 6, during a time period t1, the output signal ST(n−1) and the gate signal G(n−1) are at low voltage level. Therefore, the transistor T11 of the start-up unit 223 is turned off. Since the first low-frequency clock signal LCK1 is at high voltage level, the first control signal P(n) is pulled up to the high level, such that the transistor T42 of the first discharging unit 225A and the transistor T47 of the first leakage-preventing unit 227A are turned on, and the driving voltage Q(n) is pulled down to the first voltage level VSS1. The first control signal P(n) also turns on the transistor T44 and the transistor T32 of the first pull-down unit 224A in order to pull down the output signal ST(n) to the first voltage level VSS1 and pull down the gate signal G(n) to the second voltage level VSS2.

During a time period t2, the output signal ST(n−1) and the gate signal G(n−1) shift from low voltage level to high voltage level. Therefore, the transistor T11 of the start-up unit 223 is turned on to charge the capacitor C of the energy-store unit 222 for pulling up the driving voltage Q(n) to high voltage level, and further turning on the transistor T12 and the transistor T21 of the pull-up unit 221. In addition, since the high-frequency clock signal HCK is at low voltage level, the output signal ST(n) and the gate signal G(n) are at low level. The first control signal P(n) and the second control signal K(n) are pulled down to the third voltage level VSS3 due to high voltage level of the driving voltage Q(n). Therefore, the first discharging unit 225A, the first pull-down unit 224A, the second discharging unit 225B, and the second pull-down unit 224B are disabled.

During a time period t3, the high-frequency clock signal HCK shifts from low voltage level to high voltage level (such as 24V), and the output signal ST(n) and the gate signal G(n) are further pulled up to the high voltage level, where the driving voltage Q(n) is further pulled up due to capacitive coupling effect. The first control signal P(n) and the second control signal K(n) are still kept at the third voltage level VSS3 since the driving voltage Q(n) is still at high voltage level. Therefore, the first discharging unit 225A, the first pull-down unit 224A, the second discharging unit 225B, and the second pull-down unit 224B are still disabled. Especially, the transistor T48 of the first leakage-preventing unit 227A is turned on by the driving voltage Q(n), such that voltage level of the second terminal of the transistor T42 of the first discharging unit 225A is equal to the high voltage level (24V) of the output signal ST(n), and the first control signal P(n) at the control terminal of the transistor T42 of the first discharging unit 225A is equal to the third voltage level VSS3 (−10V), that is, a voltage level of a source terminal of the transistor T42 is higher than a voltage level of a gate terminal of the transistor T42. Therefore, the transistor T42 of the first discharging unit 225A is turned off for preventing current leakage of the capacitor C. Similarly, a voltage level of a source terminal of the transistor T43 is higher than a voltage level of a gate terminal of the transistor T43 of the second discharging unit 225B for preventing the capacitor C of the energy-store unit 222 from current leakage.

During a time period t4, the first control signal P(n) is pulled up to high voltage level due to high voltage level of the first low-frequency clock signal LCK1, such that the transistor T42 of the first discharging unit 225A and the transistor T47 of the first leakage-preventing unit 227A are turned on, and the driving voltage Q(n) is pulled down to the first voltage level VSS1. The first control signal P(n) also turns on the transistor T44 and the transistor T32 of the first pull-down unit 224A in order to pull down the output signal ST(n) to the first voltage level VSS1 and pull down the gate signal G(n) to the second voltage level VSS2. In addition, the output signal ST(n+1) shift from the low voltage level to the high voltage level for turning on the transistor T32 of the third discharging unit 225C and further pulling down the driving voltage Q(n). A transistor T31 and a transistor T41 of the third pull-down unit 225C are also turned on in order to pull down the output signal ST(n) to the first voltage level VSS1 and pull down the gate signal G(n) to the second voltage level VSS2.

According to the above arrangement, when the gate signal is pulled up to high voltage level, the first leakage-preventing unit 227A controls the voltage level of the source terminal of the transistor T42 to be higher than the voltage level of the gate terminal of the transistor T42 of the first discharging unit 225A, and the second leakage-preventing unit 227B controls the voltage level of the source terminal of the transistor T43 to be higher than the voltage level of the gate terminal of the transistor T43 of the second discharging unit 225B, such that the transistor T42 and the transistor T43 can be exactly turned off for preventing the capacitor C of the energy-store unit 222 from current leakage.

Figure 7:
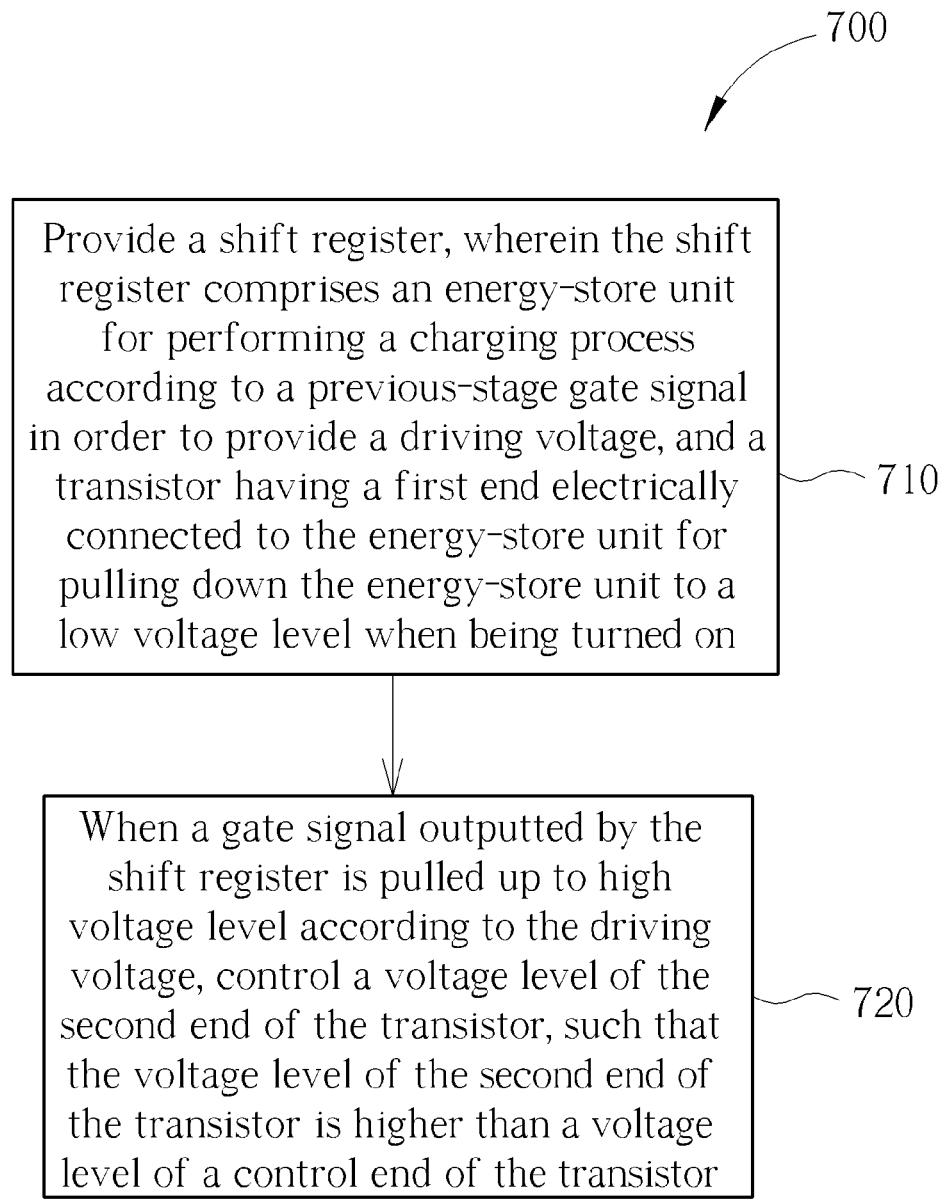
FIG. 7 is a flowchart showing a method for preventing current leakage of a shift register of the present invention.

Please refer to FIG. 7. FIG. 7 is a flowchart 700 showing a method for preventing current leakage of a shift register of the present invention. The flowchart of method for preventing current leakage of a shift register of the present invention comprises the following steps:

Step 710: Provide a shift register, wherein the shift register comprises an energy-store unit for performing a charging process according to a previous-stage gate signal in order to provide a driving voltage, and a transistor having a first terminal electrically connected to the energy-store unit for pulling down the energy-store unit to a low voltage level when being turned on; and Step 720: When a gate signal outputted by the shift register is pulled up to high voltage level according to the driving voltage, control a voltage level of the second terminal of the transistor, such that the voltage level of the second terminal of the transistor is higher than a voltage level of a control terminal of the transistor.

In contrast to the prior, when the gate signal is pulled up to high voltage level, the gate driving circuit of the present invention can utilize the leakage-preventing unit to control the voltage level of the second terminal of the transistor of the discharging unit, such that the voltage level of the second terminal of the transistor is higher than the voltage level of the control terminal of the transistor in order to prevent current leakage of the energy-store unit. Therefore, the gate driving circuit of the present invention can improve stability of the gate signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gate driving circuit capable of preventing current leakage, the gate driving circuit comprising plural-stage shift registers, an Nth stage shift register of the plural-stage shift registers comprising:
    a pull-up unit electrically connected to an output line and a gate line for pulling up a first output signal of the output line and a first gate signal of the gate line to a high voltage level according to a driving voltage and a high-frequency clock signal;
    a start-up unit for transmitting a second gate signal according to a second output signal;
    an energy-store unit electrically connected to the pull-up unit and the start-up unit for performing a charging process to provide the driving voltage to the pull-up unit according to the second gate signal;
    a first discharging unit electrically connected to the energy-store unit for pulling down the driving voltage to a first voltage level according to a first control signal;
    a first leakage-preventing unit electrically connected to the first discharging unit for turning off the first discharging unit according to the first control signal, the driving voltage, and the first output signal when the first gate signal reaches the high voltage level;
    a first pull-down unit electrically connected to the output line and the gate line for respectively pulling down the first output signal and the first gate signal to the first voltage level and a second voltage level according to the first control signal; and
    a first control unit electrically connected to the first discharging unit and the first pull-down unit for generating the first control signal according to the driving voltage, a first low-frequency clock signal, and a third voltage level;
    wherein the first voltage level, the second voltage level, and the third voltage level are different voltage levels.

2. The gate driving circuit of claim 1, wherein the first voltage level is lower than the second voltage level.

3. The gate driving circuit of claim 1, further comprising:
    a second discharging unit electrically connected to the energy-store unit for pulling down the driving voltage to the first voltage level according to a second control signal;
    a second leakage-preventing unit electrically connected to the second discharging unit for turning off the second discharging unit according to the second control signal and the driving voltage when the first gate signal reaches the high voltage level;
    a second pull-down unit electrically connected to the output line and the gate line for respectively pulling down the first output signal and the first gate signal to the first voltage level and the second voltage level according to the second control signal; and
    a second control unit electrically connected to the second discharging unit and the second pull-down unit for generating the second control signal according to the driving voltage, a second low-frequency clock signal, and the third voltage level;
    wherein a phase of the second low-frequency clock signal is opposite to a phase of the first low-frequency clock signal.

4. The gate driving circuit of claim 3, further comprising:
    a third discharging unit electrically connected to the energy-store unit for pulling down the driving voltage according to a third output signal; and
    a third pull-down unit electrically connected to the output line and the gate line for respectively pulling down the first output signal and the first gate signal to the first voltage level and the second voltage level according to the third output signal.

5. The gate driving circuit of claim 1, wherein the pull-up unit comprises:
    a first transistor, comprising:
        a first terminal for receiving the high-frequency clock signal;
        a control terminal electrically connected to the energy-store unit for receiving the driving voltage; and
        a second terminal electrically connected to the gate line; and
    a second transistor, comprising:
        a first terminal for receiving the high-frequency clock signal;
        a control terminal electrically connected to the energy-store unit for receiving the driving voltage; and
        a second terminal electrically connected to the output line.

6. The gate driving circuit of claim 1, wherein the energy-store unit comprises a capacitor.

7. The gate driving circuit of claim 1, wherein the start-up unit comprises a transistor, the transistor comprising:
    a first terminal for receiving the second gate signal;
    a control terminal for receiving the second output signal; and
    a second terminal electrically connected to the energy-store unit.

8. The gate driving circuit of claim 1, wherein the first discharging unit comprises a first transistor, the first transistor comprising:
    a first terminal electrically connected to the energy-store unit;
    a control terminal electrically connected to the first control unit for receiving the first control signal; and
    a second terminal electrically connected to the first leakage-preventing unit;

wherein the first leakage-preventing unit is for controlling a voltage level of the second terminal, such that the voltage level of the second terminal is higher than a voltage level of the control terminal when the first gate signal is pulled up to the high voltage level.

9. The gate driving circuit of claim 8, wherein the first leakage-preventing unit comprises:
   a second transistor, comprising:
      a first terminal electrically connected to the second terminal of the first transistor;
      a control terminal electrically connected to the first control unit for receiving the first control signal; and
      a second terminal electrically connected to the first voltage level; and
   a third transistor, comprising:
      a first terminal electrically connected to the second terminal of the first transistor;
      a control terminal electrically connected to the energy-store unit for receiving the driving voltage; and
      a second terminal electrically connected to the output line for receiving the first output signal.

10. The gate driving circuit of claim 1, wherein the first pull-down unit comprises:
    a first transistor, comprising:
       a first terminal electrically connected to the output line;
       a control terminal electrically connected to the first control unit for receiving the first control signal; and
       a second terminal electrically connected to the first voltage level; and
    a second transistor, comprising:
       a first terminal electrically connected to the gate line;
       a control terminal electrically connected to the first control unit for receiving the first control signal; and
       a second terminal electrically connected to the second voltage level.

11. The gate driving circuit of claim 1, wherein the first control unit comprises:
    a first transistor, comprising:
       a first terminal for receiving the first low-frequency clock signal;
       a control terminal for receiving the first low-frequency clock signal; and
       a second terminal;
    a second transistor, comprising:
       a first terminal electrically connected to the second terminal of the first transistor;
       a control terminal electrically connected to the energy-store unit for receiving the driving voltage; and
       a second terminal electrically connected to the third voltage level;
    a third transistor, comprising:
       a first terminal for receiving the first low-frequency clock signal;
       a control terminal electrically connected to the second terminal of the first transistor; and
       a second terminal electrically connected to the first discharging unit and the first leakage-preventing unit; and
    a fourth transistor, comprising:
       a first terminal electrically connected to the second terminal of the third transistor;
       a control terminal electrically connected to the energy-store unit for receiving the driving voltage; and
       a second terminal electrically connected to the first voltage level.

* * * * *